United States Patent
Sugawara

(10) Patent No.: US 10,715,027 B2
(45) Date of Patent: Jul. 14, 2020

(54) DRIVER CIRCUIT

(71) Applicant: FUJI ELECTRIC CO., LTD., Kawasaki (JP)

(72) Inventor: Takato Sugawara, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/519,551

(22) Filed: Jul. 23, 2019

(65) Prior Publication Data

US 2020/0099285 A1 Mar. 26, 2020

(30) Foreign Application Priority Data

Sep. 25, 2018 (JP) ................ 2018-179239

(51) Int. Cl.
| | |
|---|---|
| *H03K 17/687* | (2006.01) |
| *H02M 1/08* | (2006.01) |
| *H03K 17/0412* | (2006.01) |
| *H02M 3/335* | (2006.01) |
| *H02M 1/00* | (2006.01) |

(52) U.S. Cl.
CPC ............ *H02M 1/08* (2013.01); *H02M 3/335* (2013.01); *H03K 17/04123* (2013.01); *H02M 2001/0006* (2013.01)

(58) Field of Classification Search
CPC ........... H03K 17/04123; H03K 17/063; H03K 17/082; H03K 17/567; H03K 17/6877; H03K 17/6872; H03K 17/162; H03K 17/693; H03K 19/018521; H03K 19/00315; H03K 19/00361; H03K 19/0013; H03K 3/356113; H02M 1/08; H02M 3/335; H02M 2001/0006
See application file for complete search history.

(56) References Cited

U.S. PATENT DOCUMENTS

| | | | |
|---|---|---|---|
| 5,896,043 A | 4/1999 | Kumagai | |
| 2017/0040992 A1* | 2/2017 | Nakano | ............ H03K 17/08122 |
| 2017/0149330 A1* | 5/2017 | Osanai | ............ H03K 17/04123 |

FOREIGN PATENT DOCUMENTS

JP 9-214317 A 8/1997

* cited by examiner

*Primary Examiner* — Long Nguyen

(57) ABSTRACT

A driver circuit includes a gate capacitance discharge circuit that reduces a resistance value of a resistor for pulling down the gate of a PMOSFET at the output stage for a predetermined period at the timing when an NMOSFET turns on and a pull-down resistor switching circuit that switches pull-down resistors of the gate capacitance discharge circuit, based on a divided voltage into which voltage of the high voltage power supply system is divided, in which the pull-down resistor switching circuit, when the divided voltage is higher than a reference voltage Vref, switches the pull-down resistor for the predetermined period to a resistor and, when the divided voltage is the reference voltage Vref or lower, switches the pull-down resistor to a resistor having a higher resistance value than the resistor.

9 Claims, 7 Drawing Sheets

US 10,715,027 B2

DRIVER CIRCUIT

CROSS REFERENCE TO RELATED APPLICATIONS AND INCORPORATION BY REFERENCE

This application claims benefit of priority under 35 USC 119 based on Japanese Patent Application No. 2018-179239 filed on Sep. 25, 2018, the entire contents of which are incorporated by reference herein.

TECHNICAL FIELD

The present invention relates to a driver circuit that generates a high voltage signal that drives a switching device, such as a transistor, a metal oxide semiconductor field effect transistor (MOSFET), and an insulate gate bipolar transistor (IGBT), based on a low voltage control signal.

BACKGROUND ART

Electronic devices, such as a television and a personal computer, need power-supply devices that convert input voltage to output voltage optimum for components used in the electronic devices, such as converting AC power to DC power and converting voltage levels of DC power. For this reason, switching power supplies, which have high conversion efficiency, have been widely used conventionally.

A switching power supply is constituted by a switching device, such as a MOSFET and an IGBT, a transformer, and a capacitor, and the like and, by on/off control ng the switching device, converts voltage.

A control circuit that on/off controls a switching device is generally integrated into an integrated circuit (TC) Although the control circuit performs operation processing at a low voltage (for example, 1.8 V to 5.0 V) in order to reduce power consumption, driving a switching device, which is connected to an output of the control circuit, requires high voltage. For this reason, a driver circuit for a switching device has a level shift circuit that converts low power supply voltage in the control circuit to high power supply voltage (for example, 10 V to 60) for driving the switching device. Since the high power supply voltage (hereinafter, referred to as "VCC") for driving varies depending on use, it is preferable that the driver circuit be capable of coping with a wide range of power supply voltage.

FIG. 5 is a diagram illustrative of an example of a conventional driver circuit including a level shift circuit (see, for example, FIG. 1 in JP 9-214317 A). FIGS. 6, 7, and 8 and 9 are a diagram illustrative of an example of a boost converter, a diagram illustrative of a circuit portion that is a portion extracted from the circuit in FIG. 5, and timing diagrams illustrative of switching operation of the circuit portion illustrated in FIG. 7, respectively.

As illustrated in FIG. 5, a driver circuit 200 includes a level shift circuit 130 and an output buffer circuit 50. To the driver circuit 200, a boost converter 60 is connected as an example of an object to be driven.

As illustrated in FIG. 6, the boost converter 60 includes an input power supply 61, a boost inductor 62, an N-channel type MOSFET 63, a boost diode 64, and a stabilizing capacitor 65. Hereinafter, an N-channel type MOSFET is abbreviated as an "NMOSFET".

The boost converter 60 stores energy in the boost inductor 62 during an ON period of the NMOSFET 63 and supplies the stabilizing capacitor 65 with the stored energy via the boost diode 64 during an OFF period of the NMOSFET 63. This operation causes energy to be supplied to a load 66 via the stabilizing capacitor 65.

That is, the driver circuit 200 has its output terminal connected to the gate of the NMOSFET 63 in the boost converter 60 and serves as a circuit that drives the NMOSFET 63 serving as a switching device described above.

Returning to FIG. 5, the level shift circuit 130 includes a narrowly defined flip-flop circuit FF of a low power consumption type, variable resistance circuits (drain current variable circuits) 32 and 33, Zener diodes 34 and 35 for voltage clamping, and a CMOS inverter 36. In addition, the level shift circuit 130 includes one-shot circuits (monostable multivibrators) 23 and 24. The narrowly defined flip-flop circuit FF and the variable resistance circuits (drain current variable circuits) 32 and 33 constitute a broadly defined flip-flop circuit with the gate terminals of NMOSFETs 19 and 26 used as a set terminal and a reset terminal, respectively.

The flip-flop circuit FF includes a P-channel type MOSFET 18 that is on/off controlled by a signal S3 of a high voltage power supply system (hereinafter, referred to as a "high voltage system") and a P-channel type MOSFET 25 that is on/off controlled exclusively from a MOSFET 3 by a signal S11 of the high voltage system. Hereinafter, a P-channel type MOSFET is abbreviated as a "PMOSFET".

The PMOSFETs 19 and 25 constitute feedback loops with each other via drain nodes (memory nodes) N1 and N2. Specifically, the drain node N1 of the PMOSFET 18 is connected to the gate of the PMOSFET 25 and the drain node N2 of the PMOSFET 25 is connected to the gate of the PMOSFET 18. The PMOSFETs 19 and 25 have the sources electrically connected directly to an output terminal on the high potential side of a VCC power supply of the high voltage system, and the PMOSFETs 18 and 25 have the gates (drain nodes N1 and N2) thereof electrically connected, via the Zener diodes 34 and 35, to the output terminal on the high potential side of the VCC power supply. By setting Zener voltage Vz of the Zener diodes 34 and 35 at less than or equal to a breakdown voltage value of the PMOSFETs 18 and 25, voltage at the drain node N1 does not decrease to less than or equal to "VCC−Vz" because of voltage clamping by the Zener diode 35 even when the NMOSFET 19 turns on. Similarly, voltage at the drain node N2 does not decrease to less than or equal to "VCC−Vz" because of voltage clamping by the Zener diode 34 even when the NMOSFET 26 turns on.

The variable resistance circuit 32 includes the NMOSFET 19 having a high breakdown voltage, series-connected resistors 21 and 22 constituting a source follower circuit in conjunction with the NMOSFET 19, which operates in the non-saturation region, and an NMOSFET 20 for switching source resistance values that shunts the resistor 22, one of the series-connected resistors 21 and 22. Further, to the gate of the MOSFET 20, the output terminal of the one-shot circuit 23 is connected. The one-shot circuit 23 is a circuit that outputs a switching timing pulse signal S5 having a predetermined pulse width ΔT1 at a time point t1 at which a logic input signal S4, which is generated by a 5-V power supply of a low voltage power supply system (hereinafter, referred to as a "low voltage system") and has voltage of the low voltage system (for example, 0 to 5 V), rises. Therefore, at the time point t1, at which the logic input signal S4 rises, the switching timing pulse signal S5 is applied to the gate of the NMOSFET 20.

Because of the configuration described above, at the time point t1 in a state transition process of the flip-flop circuit FF at which the logic input signal S4 of the low voltage system, input from a control circuit 300, rises, the NMOSFET 19 turns on and, in conjunction therewith, generation of the switching timing pulse signal S5 causes the NMOSFET 20 to be maintained in the ON state only during a period of ΔT1. Since, for this reason, only the resistor 21 constitutes the source resistor of the NMOSFET 19, drain current ID1 flowing through the NMOSFET 19 increases to a large value. However, since, after the period of ΔT1 has elapsed, the NMOSFET 20 turns off and the resistor 22 is thereby connected in series to the resistor 21, the drain current ID1 flowing through the NMOSFET 19 rapidly decreases to a minute current sufficient to maintain conduction of the Zener diode 35.

The variable resistance circuit 33 includes the NMOSFET 26 having a high breakdown voltage, series-connected resistors 28 and 29 constituting a source follower circuit in conjunction with the NMOSFET 26, which operates in the non-saturation region, and an NMOSFET 27 for switching source resistance values that shunts the resistor 29, one of the series-connected resistors 28 and 29. Further, to the gate of the NMOSFET 27, the output terminal of the one-shot circuit 24 is connected. The one-shot circuit 24 is a circuit that outputs a switching timing pulse signal S10 having a predetermined pulse width ΔT2 at a time point t2 at which the logic input signal S4 falls. Therefore, at the time point t2, at which the logic input signal S4 falls, the switching timing pulse signal S10 is applied to the gate of the NMOSFET 27.

Because of the configuration described above, at the time point t2 in another state transition process at which the logic input signal S4 falls, the NMOSFET 26 turns on and, in conjunction therewith, generation of the switching timing pulse signal S10 causes the NMOSFET 27 to be maintained in the ON state only during a period of ΔT2. Since, for this reason, only the resistor 28 constitutes the source resistor of the NMOSFET 26, drain current ID2 flowing through the NMOSFET 26 increases to a large value. However, since, after the period of ΔT2 has elapsed, the NMOSFET 27 turns off and the resistor 29 is thereby connected in series to the resistor 28, the drain current ID2 flowing through the NMOSFET 26 rapidly decreases to a minute current sufficient to maintain conduction of the Zener diode 34.

Since, as described above, the drain current ID1 and ID2 of the NMOSFETs 19 and 26 rapidly increase in the transition processes of the flip-flop circuit FF and become minute current while the flip-flop circuit FF is in a stable state, the drain current ID1 and ID2 contribute to secure execution of state transition and reduction in power consumption. Hereinafter, drain current at the time of rapid increase is referred to as "rapidly increasing current".

The CMOS inverter 36 generates, from the logic input signal S4, an inverted signal S2 of the low voltage system (for example, 5 V) that has a reverse phase to that of the logic input signal S4 and applies the generated signal S2 to the gate of an NMOSFET 1, the gate of the NMOSFET 26, and the input terminal of the one-shot circuit 24.

The output buffer circuit 50 includes the NMOSFET 1 and a PMOSFET 2 at an output stage, a Zener diode 6, a gate capacitance discharge circuit 51 that rapidly discharges gate capacitance C3 of the output stage PMOSFET 2 on the occasion when the flip-flop circuit FF transitions to one state, and a gate capacitance charging circuit 52 that rapidly charges the gate capacitance C3 of the output stage PMOSFET 2 on the occasion when the flip-flop circuit FF transitions to the other state.

The NMOSFET 1 has the source, drain, and gate thereof electrically connected to ground, the drain of the PMOSFET 2, and the output terminal of the inverter 36, respectively. The PMOSFET 2 has the source and gate thereof electrically connected to an output terminal on the high potential side of the VCC power supply and the drain of the PMOSFET 3, respectively. Further, between the gate of the PMOSFET 2 and the output terminal on the high potential side of the VCC power supply, the Zener diode 6 for voltage clamping is connected.

The gate capacitance discharge circuit 51 is a circuit that extracts charges from the gate, having the gate capacitance C3, of the PMOSFET 2 and supplies the extracted charges to ground and thereby decreases voltage at the gate. The gate capacitance discharge circuit 51 includes a high breakdown voltage NMOSFET 4 that is on/off controlled in synchronization with the NMOSFET 19 by the logic input signal S4, series-connected resistors 7 and 8 constituting a source follower circuit (constant current circuit) in conjunction with the NMOSFET 4, which operates in the non-saturation region, and an NMOSFET 5 for switching source resistance values that shunts the resistor 8, one of the series-connected resistors 7 and 8. The NMOSFET 5 receives the timing pulse signal S5 from the one-shot circuit 23 and is on/off controlled by the timing pulse signal S5.

Although being named differently due to differences in roles, the gate capacitance discharge circuit 51 can be said to be a variable resistance circuit because of having a similar circuit configuration to those of the variable resistance circuits 32 and 33.

The gate capacitance charging circuit 52 includes the PMOSFET 3 that is a comparatively large element, is connected across the gate capacitance C3, and is on/off controlled by node voltage (signal S3) at the drain node N2. Between the gate of the PMOSFET 3 and the output terminal on the high potential side of the VCC power supply, the Zener diode 34 for voltage clamping is connected.

Meanwhile, a circuit portion illustrated in FIG. 7 that is extracted from the driver circuit 200 having the above-described configuration is configured including the NMOS-FETs 1, 4, and 5, the PMOSFETs 2 and 3, the resistors 7 and 8, and the Zener diode 6. VOUT (logic output signal) in FIG. 7 is an output of the driver circuit 200 that is output via the PMOSFET 2 at the output stage and is connected to the gate of the NMOSFET 63 of the boost converter 60 in the circuit example illustrated in FIGS. 5 and 6.

Hereinafter, operation of the circuit portion illustrated in FIG. 7 will be described.

In the circuit portion, as illustrated in a timing diagram in FIG. 8, when the signal S2 turns to a high level (5 V) and the NMOSFET 1 thereby turns on and a signal S1 turns to a high level (VCC) and the PMOSFET 2 thereby turns off, a signal of a low level (0 V) is output as VOUT. When the signal S2 turns to a low level (0 V) and the NMOSFET 1 thereby turns off and the signal S1 turns to a low level (VCC-5 V) and the PMOSFET 2 thereby turns on, a signal of a high level (VCC) is output as VOUT.

Although having a high breakdown voltage of 10 V or more with respect to drain-source voltage (hereinafter, referred to as "Vds"), the NMOSFET 1 and the PMOSFET 2 have a low breakdown voltage of 5 V with respect to gate-source voltage (hereinafter, referred to as "Vgs"). Thus, the signals S1 and S2 serve as drive signals in a range from VCC to VCC-5 V and a range from 0 V to 5 V, respectively. The signal S1 driving the PMOSFET 2 is generated in accordance with a timing diagram in FIG. 9. That is, the signal S1 is at the high level when the signals S3 and S4 are at low levels. The signal S5 in FIG. 9 is a one-shot pulse signal that is a signal that rises only for a period of ΔT1 in response to a rise of the signal S4.

When the PMOSFET 2 turns from the OFF state to the ON state, by turning on the NMOSFETs 4 and 5 at the same time only for a short transition period (the period of ΔT1) in which the signal S1 turns from the high level (VCC) to the low level (VCC-5 V), the gate of the PMOSFET 2 is pulled down by the resistor 7.

Specifically, when the signal S1 transitions from the high level to the low level, the signal S4 is turned to a high level and, in conjunction therewith, the signal S5 is turned to a high level (5 V) only for the transition period. Subsequently, when the signal S5 turns to a low level, the NMOSFET 5 turns off and only the NMOSFET 4 maintains the ON state, which causes the PMOSFET 2 to maintain the ON state with an impedance of the series connection of the resistors 7 and 8. On this occasion, a resistor having a low resistance is selected as the resistor 7 in order to extract charges accumulated at the gate of the PMOSFET 2 in a short period of time, and a resistor having a high resistance is selected as the resistor 8 in order to reduce current consumption. This configuration enables the switching device (NMOSFET 63) to be driven with small power consumption. In addition, the source-gate voltage of the PMOSFET 2 is clamped by the Zener diode 6 lest Vgs exceeds a gate breakdown voltage when the gate of the PMOSFET 2 is pulled down.

SUMMARY OF INVENTION

The inventors have acquired knowledge that, on the occasion when a conventional driver circuit including a configuration of the above-described circuit potion illustrated in FIG. 7 is used with a wide range of VCC, in some cases, discharge current of the gate capacitance of the PMOSFET 2 increases to an excessive level and Vgs of the PMOSFET 2 therefore exceeds a breakdown voltage at the time of discharge, resulting in a breakdown of the PMOSFET 2, in a region where VCC is comparatively low.

FIG. 10 is a partial circuit diagram for a description of a mechanism in which Vgs of the PMOSFET 2 exceeds a breakdown voltage in a region where VCC is comparatively low. FIG. 11 is a diagram illustrative of a relationship between the signal S1 and the Zener voltage Vz (breakdown voltage) of the Zener diode 6 in the cases where VCC is high and low.

As illustrated in the partial circuit in FIG. 10, a resistor R (resistor 7) is connected between the source of the NMOSFET 4 and ground and, in conjunction therewith, parasitic capacitance C1 is connected between a connection point between the source and the resistor R and ground. In FIG. 10, it is assumed that current flowing through the drain of the NMOSFET 4, current flowing through the resistor 7, and current flowing through the parasitic capacitance C1 when the signal S4 rises from 0 V to 5 V are denoted by i0, i1, and i2, respectively. In this configuration, the formulae (1) to (3) below hold true.

$$i0 = K(5 - Vs - V_T)^2(1 + \lambda Vds) \quad (1)$$

$$Vs = R \times i1 = (1/C1)\int i2\, dt \quad (2)$$

$$i0 = i1 + i2 \quad (3)$$

In the above formula (1), K, $V_T$, λ are a constant, a threshold voltage of the NMOSFET 4, and a channel length modulation coefficient of the NMOSFET 4, respectively.

When it is assumed that the current i0 is constant, the formula (4) below holds true based on the above formulae (2) and (3).

$$Vs = R \times i0(1 - \exp(-t/(C1 \times R))) \quad (4)$$

In the formula (4), a timing at which t=0 is a timing at the moment when the signal S4 has changed from 0 V to 5 V.

Hereinafter, the above-described mechanism will be described on the assumption that, when excessive voltage is applied to the Zener diode 6, it takes, although being short, a certain amount of non-zero time for the Zener diode 6 to clamp the gate-source voltage.

(1) When VCC is Substantially High

Since, when VCC is substantially high, the current i0 at the moment when the signal 54 has risen to 5 V becomes substantially large, the parasitic capacitance C1 is instantaneously charged and Vgs of the NMOSFET 4 thereby becomes small. Since Vgs becomes small, on-resistance of the NMOSFET 4 increases and the current i0 is thereby reduced. Since the amount of gate charges of the PMOSFET 2 that had been discharged by the time when the current i0 has been reduced is almost equal to the amount of charges accumulated in the parasitic capacitance C1, Vgs of the PMOSFET 2 stays less than or equal to a breakdown voltage. Since subsequent decrease speed of Vgs is controlled, the response of the Zener diode 6 catches up with the decrease in Vgs. Therefore, as illustrated by a waveform illustrated on the high VCC side in FIG. 11, Vgs can be clamped to less than or equal to the breakdown voltage.

(2) When VCC is Insufficiently High

Since, when VCC is insufficiently high, the current i0 at the moment when the signal S4 has risen to 5 V is large to some degree but smaller than that in the above-described case (1), it takes a longer time to charge the parasitic capacitance C1 than the case (1). Since the amount of charges dissipated through the resistor R increases while charged voltage of the parasitic capacitance C1 increases to a voltage at which the current i0 is reduced as in the above-described case (1), Vgs of the PMOSFET 2 when the current i0 is reduced decreases to lower than that in the above-described case (1) and, as illustrated by a waveform illustrated on the low VCC side in FIG. 10, Vgs of the PMOSFET 2 exceeds the breakdown voltage before the Zener diode 6 responds. As a result, a gate breakdown occurs.

That is, setting the resistance value of the resistor R to be small in order to rapidly extract charges accumulated at the gate of the PMOSFET 2 causes an adverse effect that, in a region where VCC is comparatively low, the amount of charges dissipated through the resistor R increases and a gate breakdown thereby occurs.

If the Zener diode 6 is a diode having ideal characteristics, it is possible to prevent such a breakdown from occurring because clamping by such a diode starts to work before Vgs of the PMOSFET 2 exceeds a breakdown voltage. However, the current state is that, since actually fabricated diodes have internal impedance and delay time, Vgs cannot be instantaneously clamped down to less than or equal to a breakdown voltage over a wide range of VCC.

Although setting the resistance value of the resistor R to be large enables Vgs to be reduced to less than or equal to a breakdown voltage with low VCC, a problem may occur in that, when VCC is high, the signal S1 cannot be sufficiently pulled down, resulting in that the PMOSFET 2 cannot be turned on.

Accordingly, an object of the present invention is to provide a driver circuit that is capable of suppressing voltage applied to an output stage transistor to less than or equal to a breakdown voltage by switching resistance values of a resistor pulling down the gate of the output stage transistor depending on voltage levels of a high voltage power supply system.

In order to achieve the object mentioned above, according to a first aspect of the present invention, there is provided a driver circuit for converting a logic input signal input from a first circuit operating in a low voltage power supply system to a logic output signal driving a second circuit operating in a high voltage power supply system, the driver circuit including: a first transistor configured to be a first conductivity type transistor and on/off controlled by the logic input signal; a second transistor configured to be a second conductivity type transistor, connected in series to the first transistor between a high potential side and a low potential side of the high voltage power supply system, and on/off controlled exclusively from the first transistor; an output stage transistor configured to be a second conductivity type transistor at an output stage and on/off controlled by voltage at a connection point between the first transistor and the second transistor; a variable resistance circuit configured to be connected between a gate of the output stage transistor and the low potential side of the high voltage power supply system via the first transistor; and a resistor switching circuit configured to reduce a resistance value of the variable resistance circuit for a predetermined period at a timing when the first transistor turns on and, when voltage of the high voltage power supply system is higher than a preset reference voltage, switch a resistance value of the variable resistance circuit during the predetermined period to a first resistance value and, when voltage of the high voltage power supply system is lower than or equal to the reference voltage, switch the resistance value of the variable resistance circuit during the predetermined period to a second resistance value larger than the first resistance value.

Further, in order to achieve the object mentioned above, according to a second aspect of the present invention, there is provided a driver circuit for converting a logic input signal input from a first circuit operating in a low voltage power supply system to a logic output signal driving a second circuit operating in a high voltage power supply system, the driver circuit including: a first transistor configured to be a first conductivity type transistor and on/off controlled by the logic input signal; a second transistor configured to be a second conductivity type transistor and connected in series to the first transistor between a high potential side and a low potential side of the high voltage power supply system; an output stage transistor configured to be a second conductivity type transistor at an output stage and on/off controlled by voltage at a connection point between the first transistor and the second transistor; a variable resistance circuit configured to be connected between a gate of the output stage transistor and the low potential side of the high voltage power supply system via the first transistor; and a flip-flop circuit configured to include third and fourth transistors configured to be first conductivity type transistors and on/off control led complementarily with each other by the logic input signal, a fifth transistor configured to be a second conductivity type transistor and connected in series to the third transistor between the high potential side and the low potential side of the high voltage power supply system, and a sixth transistor configured to be a second conductivity type transistor and connected in series to the fourth transistor between the high potential side and the low potential side of the high voltage power supply system, wherein a first memory node configured to be a connection point between the third transistor and the fifth transistor is connected to a gate of the sixth transistor, a second memory node configured to be a connection point between the fourth transistor and the sixth transistor is connected to a gate of the fifth transistor, and gates of the third and fourth transistors serve as input terminals, wherein the first memory node or the second memory node is connected to a gate of the second transistor, the driver circuit further comprising a resistor switching circuit configured to reduce a resistance value of the variable resistance circuit for a predetermined period at a timing when the first transistor turns on and, when voltage of the high voltage power supply system is higher than a preset reference voltage, switch a resistance value of the variable resistance circuit during the predetermined period to a first resistance value and, when voltage of the high voltage power supply system is lower than or equal to the reference voltage, switch the resistance value of the variable resistance circuit during the predetermined period to a second resistance value larger than the first resistance value.

As described thus far, when voltage of the high voltage power supply system s higher than a preset reference voltage, a resistance value of the variable resistance circuit during a predetermined period is switched to a first resistance value and, when voltage of the high voltage power supply system is lower than or equal to the reference voltage, a resistance value of the variable resistance circuit is switched to a second resistance value that is larger than the first resistance value. This switching enables the gate of the output stage transistor to be pulled down by the second resistance value that is a comparatively high resistance value when the voltage of the high voltage power supply system is lower than or equal to the reference voltage (when the voltage of the high voltage power supply system is set at an insufficiently high voltage value), which enables discharge current from the gate capacitance of the output stage transistor to be suppressed. As a result, it becomes possible to prevent voltage exceeding a breakdown voltage from being applied to the output stage transistor and to improve reliability in driving of a switching device in a wide range of voltage of the high voltage power supply system.

DETAILED DESCRIPTION

Next, an embodiment of the present invention will now be described with reference to the drawings in the following description of the drawings, the same or similar reference signs are assigned to the same or similar portions. However, it should be noted that the drawings include schematic figures, and vertical and horizontal dimensions and scales of members or portions are different from actual ones. Therefore, there is a case where specific dimensions and scales should be determined in consideration of the following description. It should also be noted that the drawings include portions having different dimensional relationships and ratios from each other.

In addition, the following embodiment indicates devices and methods to embody the technical idea of the present invention by way of example, and the technical idea of the present invention does not limit the materials, shapes, structures, arrangements, and the like of the constituent components to those described below. The technical idea of the present invention can be subjected to a variety of alterations within the technical scope prescribed by the claims described in CLAIMS.

Embodiment

Configuration

First, a configuration of a driver circuit 100 according to an embodiment of the present invention will be described.

Figure 5:
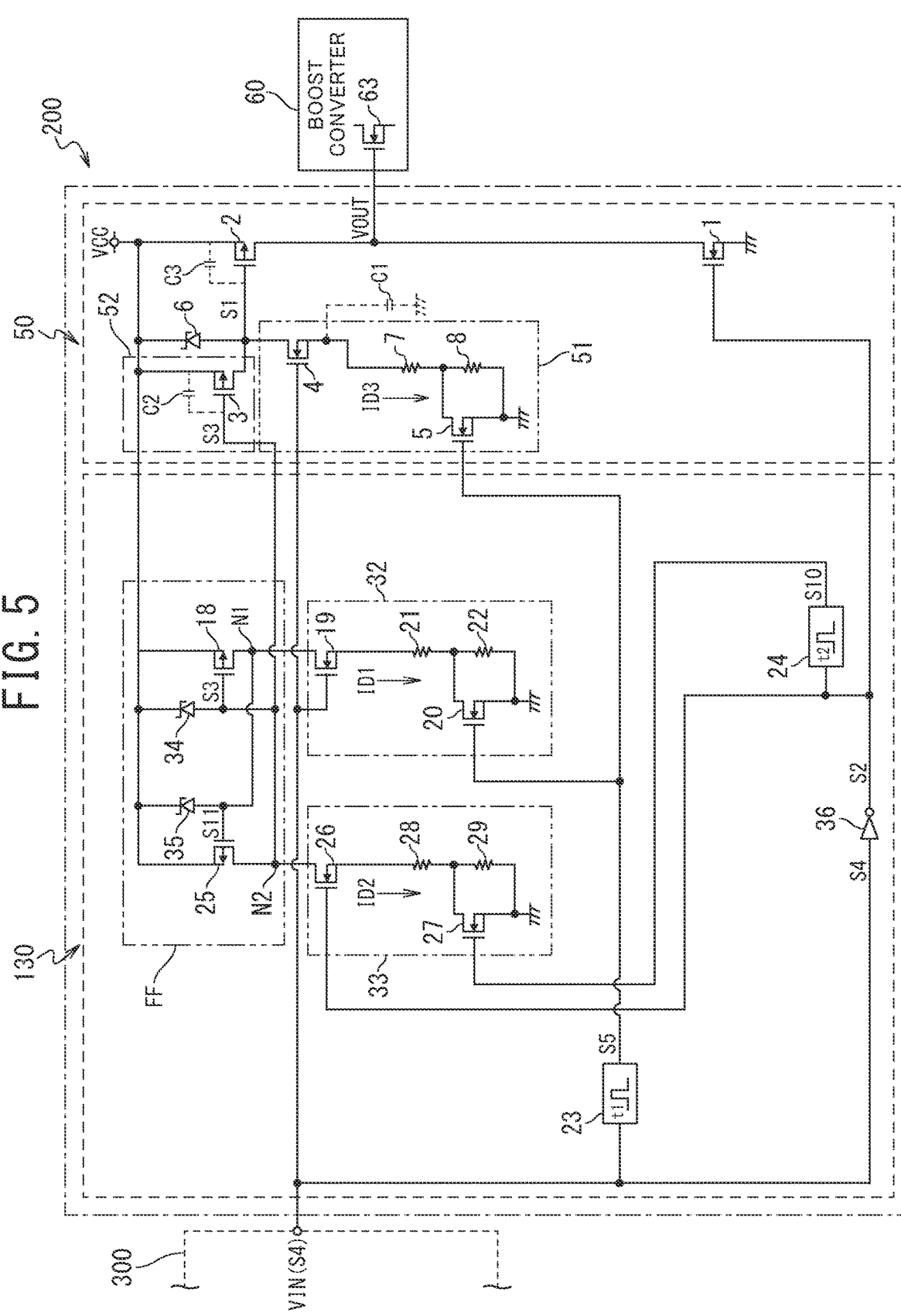
FIG. 5 is a diagram illustrative of an example of a driver circuit including a level shift circuit according to a conventional technology.

Hereinafter, the same reference signs are assigned to constituent components similar to those of the above-described driver circuit 200 in FIG. 5 and a description thereof is omitted, and different portions will be described in detail.

Figure 1:
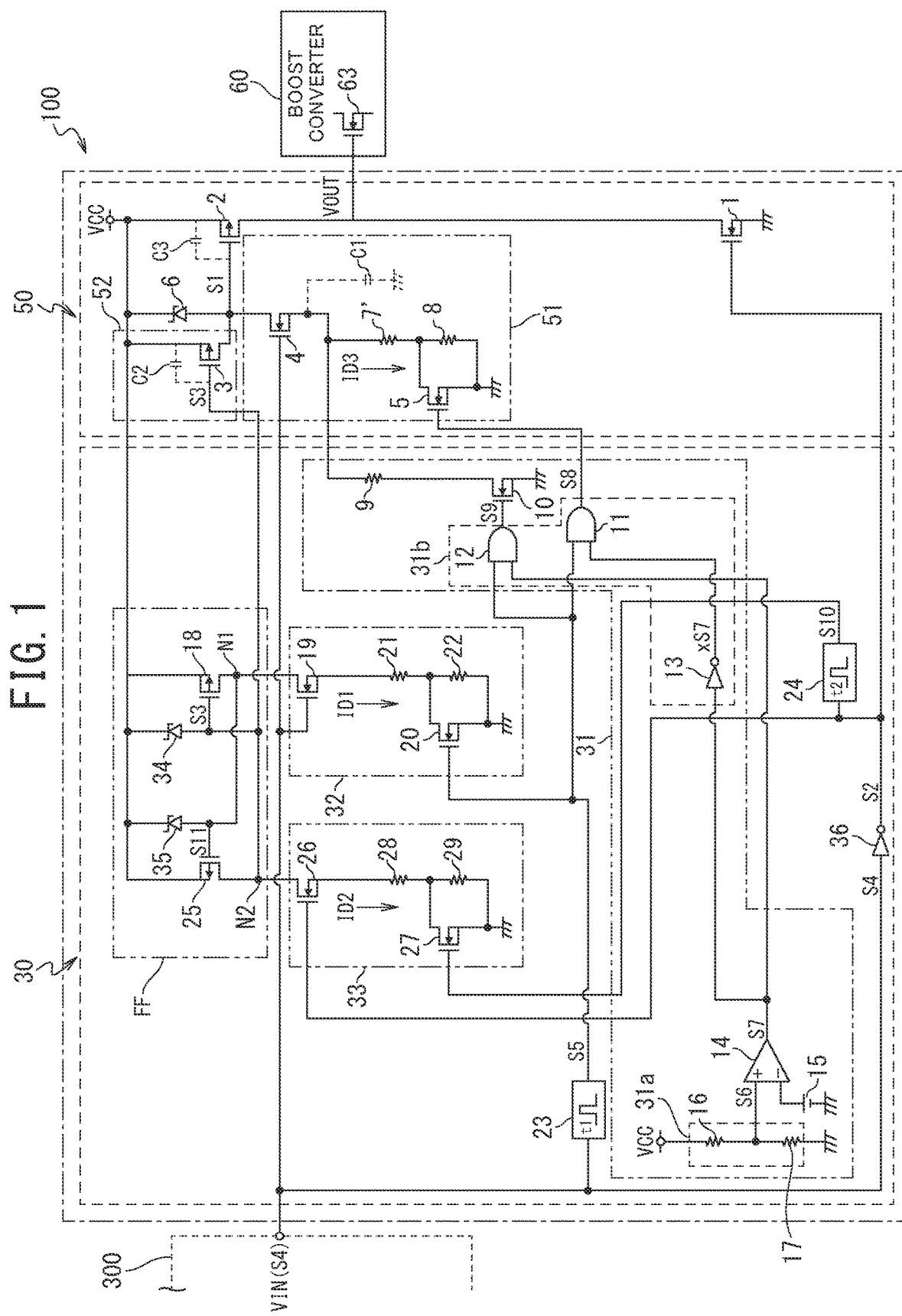
FIG. 1 is a diagram illustrative of an example of a driver circuit according to an embodiment of the present invention.

As illustrated in FIG. 1, the driver circuit 100 includes a level shift circuit 30 and an output buffer circuit 50. A connection point (output terminal with a reference sign VOUT) between a PMOSFET 2 and an NMOSFET 1 in the output buffer circuit 50 of the driver circuit 100 is connected to the gate of an NMOSFET 63 of a boost converter 60.

The level shift circuit 30 includes a flip-flop circuit FF, a pull-down resistor switching circuit 31, variable resistance circuits 32 and 33, Zener diodes 34 and 35, a CMOS inverter 36, and one-shot circuits 23 and 24. That is, the level shift circuit 30 has a configuration in which the pull-down resistor switching circuit 31 is added to the level shift circuit 130 illustrated in FIG. 5.

Further, the resistor 7 constituting the gate capacitance discharge circuit 51 is changed to a resistor 7' that has a higher resistance value than the resistor 7. That is, the resistor 7 is changed to the resistor 7' that has a higher resistance value than that of the resistor 7 that conventionally caused a gate breakdown in the PMOSFET 2 at a low VCC.

The pull-down resistor switching circuit 31 includes a voltage detection circuit 31a, a switching circuit 31b, a resistor 9, an NMOSFET 10, a comparator 14, and a reference voltage source 15.

The voltage detection circuit 31a is a circuit that detects divided voltage S6 into which VCC (for example, 10 V to 60 V), which is voltage of a VCC power supply of a high voltage system, is divided and includes resistors 16 and 17.

The resistors 16 and 17 are resistors that divide VCC into a voltage lower than VCC, as expressed by the formula (5) below. The resistor 16 has one end portion and the other end portion thereof electrically connected to an output terminal on the high potential side of the VCC power supply and one end portion of the resistor 17, respectively. On the other hand, the resistor 17 has the other end portion thereof connected to ground. A connection point between the resistors 16 and 17 is electrically connected to one of two input terminals of the comparator 14. That is, the divided voltage S6, into which VCC is divided by the resistors 16 and 17, is input to one of the input terminals of the comparator 14.

$$S6=VCC\times((\text{resistance of resistor } 17/((\text{resistance of resistor } 16)+(\text{resistance of resistor } 17))) \quad (5)$$

For example, setting the same resistance value to both the resistors 16 and 17 causes the divided voltage S6 to be "VCC/2".

The reference voltage source 15 is a power supply that supply reference voltage Vref and has an output terminal on the high potential side electrically connected to the other of the input terminals of the comparator 14. That is, the reference voltage Vref is input to the other of the input terminals of the comparator 14. The reference voltage Vref is set using, as a reference, a boundary voltage between a maximum voltage of a voltage range in which the gate of the PMOSFET 2 suffers a breakdown and a minimum voltage of a voltage range in which the gate of the PMOSFET 2 does not suffer a breakdown, when a pull-down resistor to pull down the gate of the PMOSFET 2 is the resistor 9. Specifically, since VCC is divided in the present embodiment, the reference voltage Vref is set in consideration of the amount of voltage drop due to the voltage division and a safety margin.

The comparator 14 compares the input divided voltage S6 with the reference voltage Vref and outputs a signal S7 that indicates a result of the comparison. Specifically, the comparator 14 outputs the signal S7 of the high level when the divided voltage S6 is higher than the reference voltage Vref and the signal S7 of the low level when the divided voltage S6 is lower than or equal to the reference voltage Vref.

The switching circuit 31b is a circuit that generates signals S8 and S9 for switching resistors used to pull down the gate of the PMOSFET 2 and includes AND circuits 11 and 12 and an inverter 13.

The inverter 13 is a circuit that inverts the signal S7, which is output from the comparator 14, and has the input terminal and the output terminal thereof electrically connected to the output terminal of the comparator 14 and one of the two input terminals of the AND circuit 11, respectively. That is, the signal S7 is input to the input terminal of the inverter 13, and a signal xS7 to which the signal S7 is inverted is input to one input terminal of the AND circuit 11.

The AND circuit 11 has the other input terminal and the output terminal thereof electrically connected to the output terminal of the one-shot circuit 23 and the gate of an NMOSFET 5, respectively. The AND circuit 11 performs a logical product operation of the signal xS7 output from the inverter 13 and a signal S5 output from, the one-shot circuit 23 and outputs a signal S8 that indicates a result of the operation. Specifically, the AND circuit 11 outputs the signal S8 of the high level when both input signals are at the high level and the signal S8 of the low level when at least either of the input signals is at the low level.

The AND circuit 12 has one and the other of the two input terminals thereof electrically connected to the output terminal of the comparator 14 and the output terminal of the one-shot circuit 23, respectively. That is, the signal 57 and the signal S5 are input to one input terminal and the other input terminal of the AND circuit 12, respectively. The AND circuit 12 performs a logical product operation of the input signals S7 and S5 and outputs a signal S9 that indicates a result of the operation. Specifically, the AND circuit 12 outputs the signal S9 of the high level when both input signals are at the high level and the signal S9 of the low level when at least either of the input signals is at the low level.

The NMOSFET 10 has the source and gate thereof electrically connected to ground and the output terminal of the AND circuit 12, respectively. That is, the signal S9 is input to the gate of the NMOSFET 10, and the NMOSFET 10 is on/off controlled by the signal S9.

The resistor 9 is a resistor that pulls down the gate of the PMOSFET 2 when both the NMOSFETs 4 and 10 turn on and has one end portion and the other end portion thereof electrically connected to the source of the NMOSFET 4 and the drain of the NMOSFET 10, respectively. In the present embodiment, the resistors 9 and 7' have a magnitude relation in the resistance values therebetween as "resistor 9>resistor 7'". In addition, the resistance value of the resistor 9 is set at a value within a range of resistance values with which the PMOSFET 2 operates normally without Vgs thereof exceeding a breakdown voltage at a VCC higher than the reference voltage Vref. For example, the resistance value of the resistor 9 is set at a resistance value close to the resistance value of the conventional resistor 7.

On the other hand, the NMOSFET 5 of the present embodiment is on/off controlled by the signal S8 output from the AND circuit 11. That is, when the signal S8 is at the high level, the NMOSFET 5 turns on and switches the pull-down resistor for pulling down the gate of the PMOSFET 2 to only the resistor 7', and, when the signal S8 is at the low level, the NMOSFET 5 turns off and switches the pull-down resistor to series-connected resistors 7' and 8.

Reference signs C1, C2, and C3 in FIG. 1 are parasitic capacitance connected to the source of the NMOSFET 4, parasitic capacitance (gate capacitance) connected between the source and gate of a PMOSFET 3, and parasitic capacitance (gate capacitance) connected between the source and gate of the PMOSFET 2, respectively.

Operation

Next, operation of the driver circuit 100 according to the present invention will be described, based on FIGS. 1 to 4.

Figure 2:
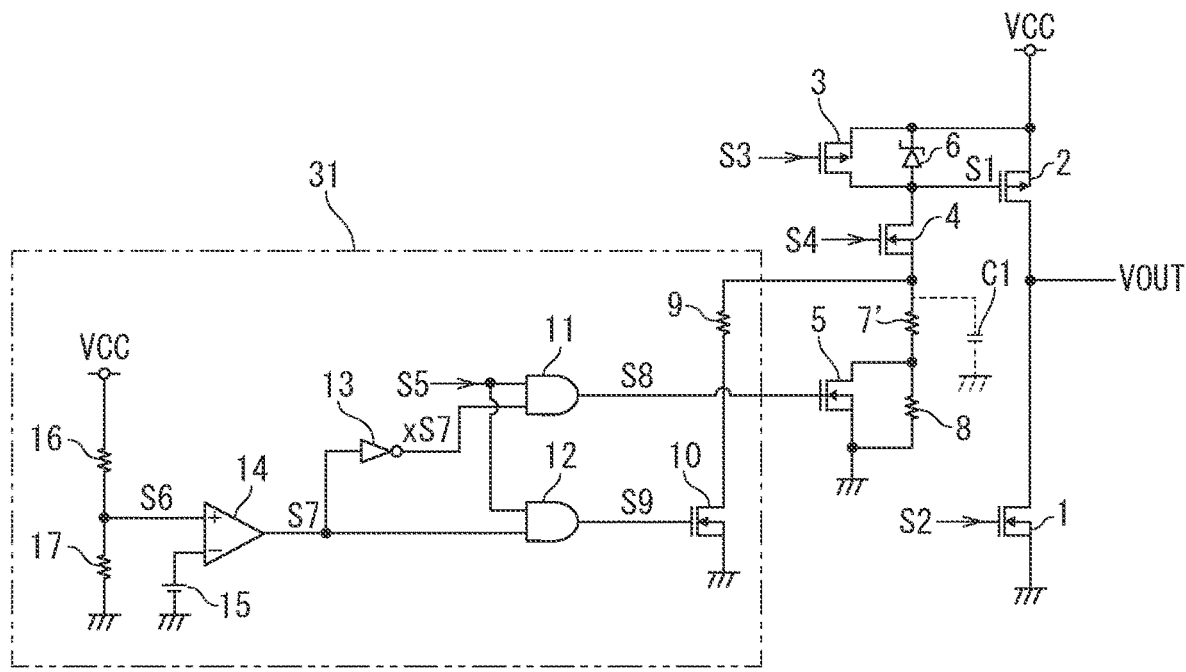
FIG. 2 is a diagram illustrative of a circuit portion relating to a characteristic portion of the present invention and extracted from the driver circuit in FIG. 1.
Figure 6:
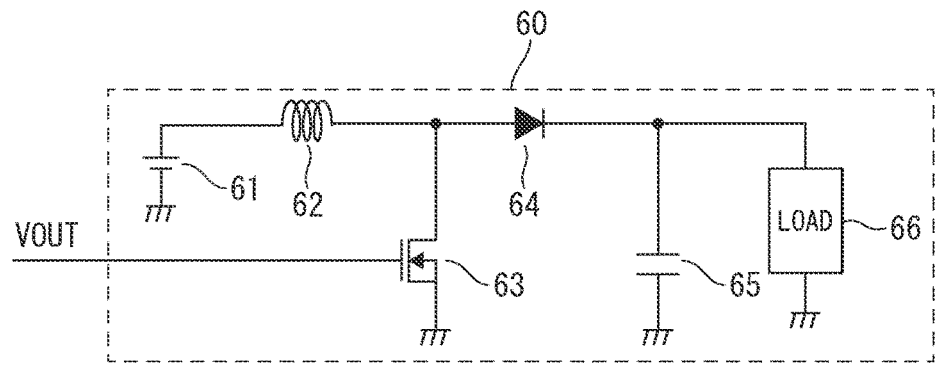
FIG. 6 is a circuit diagram illustrative of an example of a boost converter that is as example of a switching device driven by the driver circuit.
Figure 7:
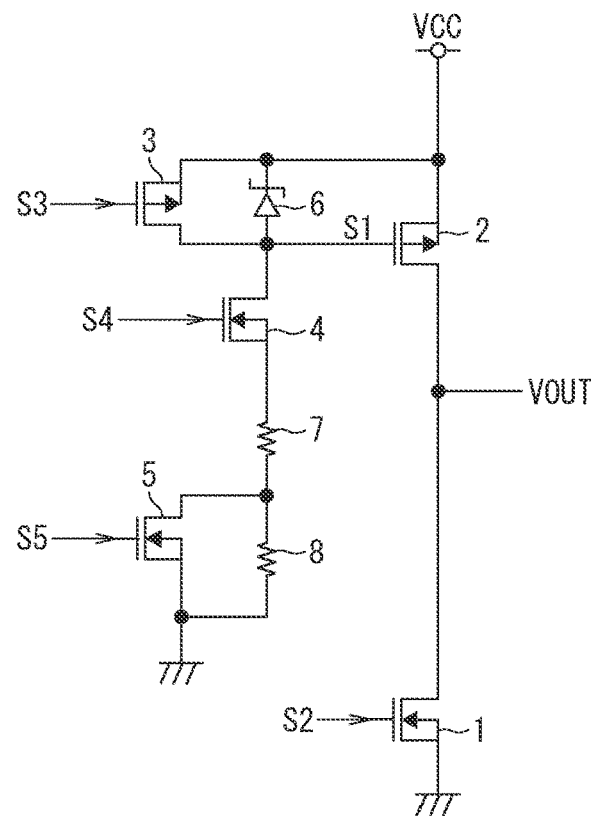
FIG. 7 is a diagram illustrative of a circuit portion that is a portion extracted from the circuit in FIG. 5.
Figure 8:
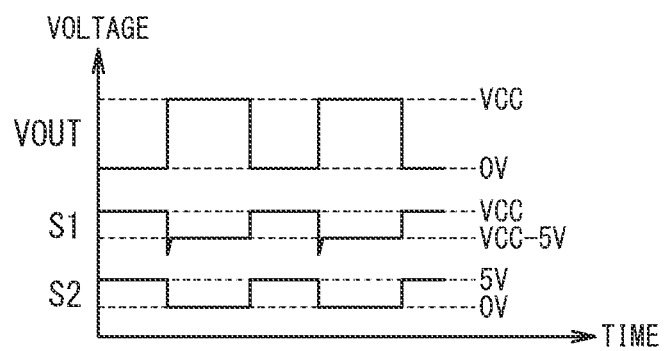
FIG. 8 is a timing diagram illustrative of switching operation of the circuit portion illustrated in FIG. 7.
Figure 9:
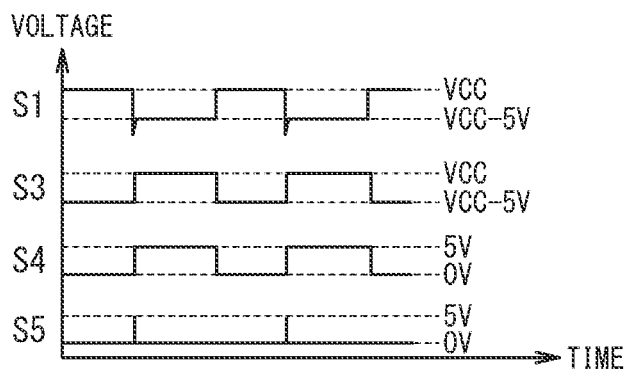
FIG. 9 is another timing diagram illustrative of the switching operation of the circuit portion illustrated in FIG. 7.
Figure 10:
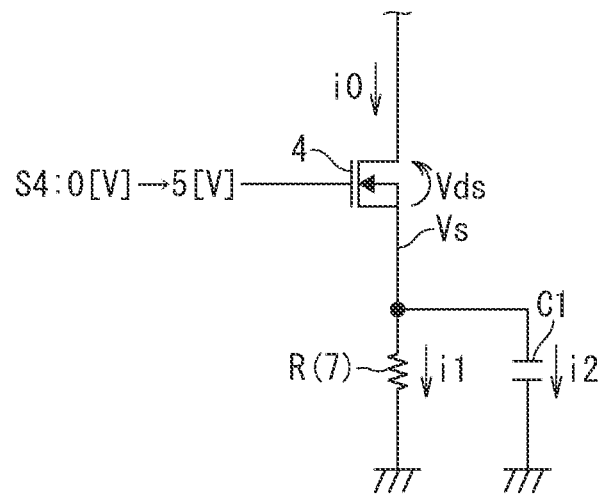
FIG. 10 is a partial circuit diagram for a description of a mechanism in which Vgs of a PMOSFET 2 exceeds a breakdown voltage in a region where VCC is comparatively low.
Figure 11:
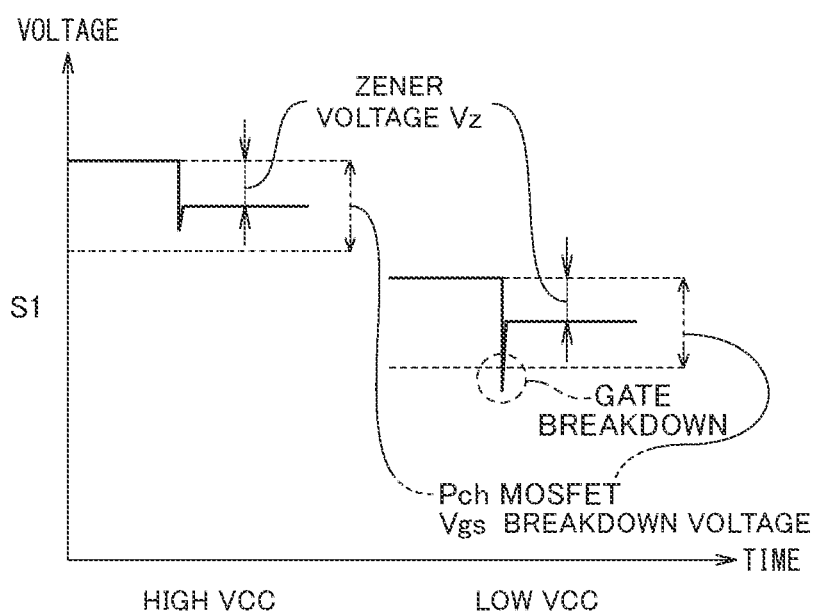
FIG. 11 is a diagram illustrative of a relationship between a signal S1 and Zener voltage Vz of a Zener diode 6 in the cases where VCC is high and low in the conventional configuration.

First, operation of the pull-down resistor switching circuit 31, which is a characteristic portion of the present invention, will be described in detail, based on FIGS. 2 to 4. A circuit portion illustrated in FIG. 2 is the pull-down resistor switching circuit 31 and the circuit portion illustrated in FIG. 7 extracted from the driver circuit 100 illustrated in FIG. 1. However, the resistor 7 in FIG. 6 is changed to the resistor 7'.

That is, the circuit portion illustrated in FIG. 2 is configured including the pull-down resistor switching circuit 31, the NMOSFETs 1, 4, and 5, the PMOSFETs 2 and 3, the resistors 7' and 8, and a Zener diode 6.

An operation on the occasion when the divided voltage S6 is linearly varied from a voltage lower than the reference voltage Vref to a voltage higher than the reference voltage Vref will be described below.

Figure 3:
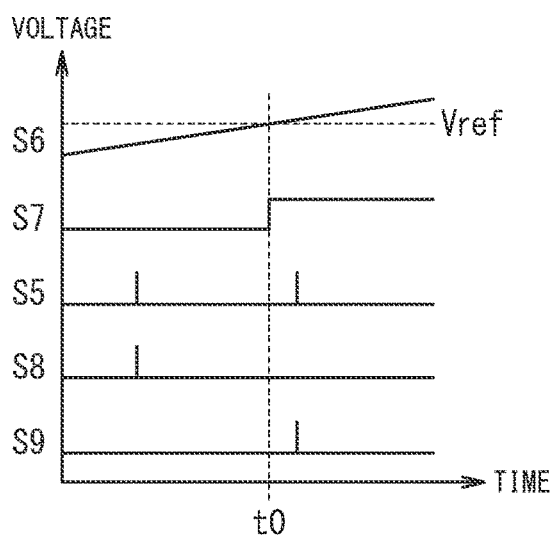
FIG. 3 is a timing diagram illustrative of operation of a resistor switching circuit when VCC is varied.
Figure 4:
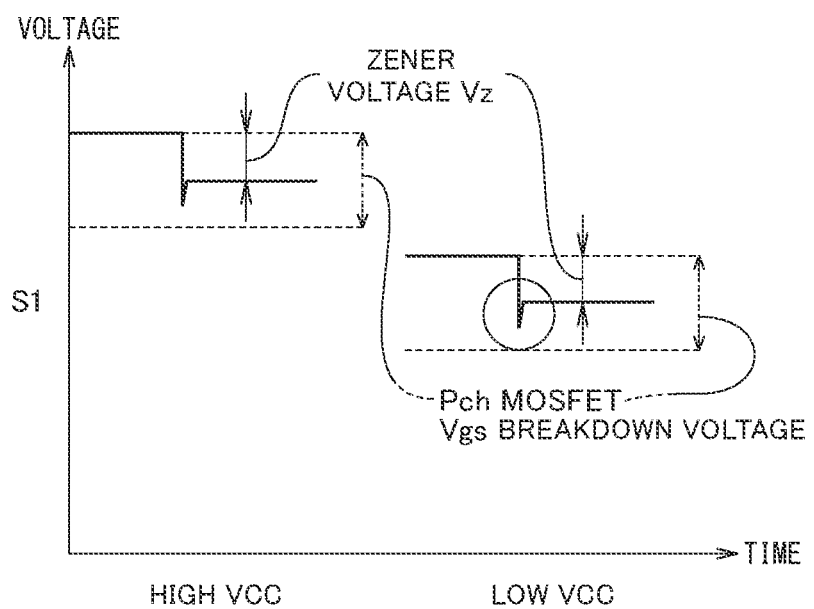
FIG. 4 is a diagram illustrative of a relationship between a signal S1 and Zener voltage Vz of a Zener diode 6 in the cases where VCC is high and low in the configuration of the embodiment.

As illustrated in FIG. 3, before a time t0, the divided voltage S6 is lower than or equal to the reference voltage Vref, and the output signal S7 of the comparator 14 is therefore maintained at the low level. When the signal S7 is at the low level, the output signal S9 of the AND circuit 12 is maintained at the low level even when the signal S5 turns to the high level, and the NMOSFET 10 is therefore maintained in the OFF state.

The signal S7 is inverted by the inverter 13 to the signal xS7 of the high level, which is input to the AND circuit 11. Thus, when the signal S5 turns to the high level, the output signal S8 of the AND circuit 11 also turns to the high level and the NMOSFET 5 thereby turns on. At this time, a signal S4 (logic input signal) input from a control circuit 300 has turned to the high level and the NMOSFET 4 has turned on, and the gate of the PMOSFET 2 is therefore pulled down by the resistor 7'.

Since, when the divided voltage is low (S6≤Vref), the gate of the PMOSFET 2 is pulled down by the resistor 7' in this way, it becomes possible to reduce discharge current compared with a case where the gate of the PMOSFET 2 is pulled down by the conventional resistor 7. This reduction in the discharge current enables voltage at the time when the PMOSFET 2 transitions from the OFF state to the ON state to be increased to a higher level than that in the case where the gate of the PMOSFET 2 is pulled down by the resistor 7. As a result, as illustrated by a waveform illustrated on the low VCC side in FIG. 4, Vgs stays less than or equal to a breakdown voltage and clamping of Vgs by the Zener diode 6 catches up with the decrease in Vgs, and, therefore, Vgs never exceeds the breakdown voltage.

On the other hand, after the time t0, the divided voltage S6 exceeds the reference voltage Vref, and the output signal S7 of the comparator 14 therefore turns over from the low level to the high level. The signal S7 is inverted by the inverter 13 to the signal xS7 of the low level, which is input to the AND circuit 11. Thus, when the signal S5 turns to the high level, the output signal S8 of the AND circuit 11 turns to the low level and the NMOSFET 5 thereby turns off. On the other hand, when the signal S7 turns to the high level, the output signal S9 of the AND circuit 12 turns to the high level at the timing when the signal S5 turns to the high level, and the NMOSFET 10 thereby turns on. At this time, the signal 34 has turned to the high level and the NMOSFET 4 has turned on, and the gate of the PMOSFET 2 is therefore pulled down by the resistor 9. That is, when VCC is high (S6>Vref), the gate of the PMOSFET 2 is pulled down by the resistor 9, which has a smaller resistance value than the resistor 7'. In this case, since, as with the conventional configuration, clamping of Vgs by the Zener diode 6 catches up with the decrease in Vgs, Vgs never exceeds the breakdown voltage, as illustrated by a waveform illustrated on the high VCC side in FIG. 4.

Next, operation of the whole of the driver circuit 100 will be described.

It is nova assumed that VCC is low and the divided voltage 36 of VCC is lower than the reference voltage Vref. In this case, the signal S7 of the low level is output from the comparator 14, and the signal xS7 of the high level, to which the signal 37 is inverted, is output from the inverter 13.

When, while the driver circuit 100 is in this state, the input signal S4 turns to the high level, the pulse signal S5 with pulse width ΔT1 is output from the one-shot circuit 23 and the input signal 34 turns on the NMOSFETs 4 and 19. On the other hand, the pulse signal 35 turns on an NMOSFET 20 and, in conjunction therewith, turns on the NMOSFET 5 via the AND circuit 11. The NMOSFETs 4 and 5 turning on causes the gate of the PMOSFET 2 to be pulled down by the resistor 7'.

At this time, a signal S2 to which the input signal S4 is inverted by the inverter 36 is at the low level, and output from the one-shot circuit 24 (pulse signal S10 with width ΔT2) is also maintained at the low level. Thus, the NMOSFETs 1, 27, and 26 are in the OFF state.

When the NMOSFETs 19 and 20 turn on with the NMOSFETs 26 and 27 in the OFF state, a PMOSFET 25 has gate voltage thereof pulled down via a resistor 21 and thereby turns on.

When the PMOSFET 25 is brought to the ON state, a signal S3 that is input to the gate of the PMOSFET 3 is raised to VCC and the PMOSFET thereby turns off, and a pathway through which VCC is supplied to the gate of the PMOSFET 2 is therefore cut off.

On the other hand, since the NMOSFETs 4 and 5 are in the ON state as described above, a signal S1 input to the gate of the PMOSFET 2 turns to the low level and the PMOSFET 2 thereby turns on.

Since, as described above, the NMOSFET 1 is in the OFF state, VOUT turns to the high level and the NMOSFET 63 of the boost converter 60 thereby turns on.

Subsequently, when ΔT1 has elapsed, the pulse signal S5 turns to the low level and the NMOSFETs 5 and 20 thereby turn off.

Since the input signal S4 is maintained at the high level, the NMOSFETs 4 and 19 are maintained in the ON state, the gate of the PMOSFET 2 is pulled down by the series-connected resistors 7' and 8, the gate of the PMOSFET 25 is pulled down by the series-connected resistors 21 and 22, and the PMOSFETs 2 and 25 is maintain in the ON state.

Since, at this time, the resistance value has increased to a larger value than that in the period during which the pulse signal S5 was at the high level, it becomes possible to maintain VOUT in the ON state with small power consumption.

On the other hand, when VCC is high and the divided voltage S6 is higher than the reference voltage Vref, the output signal S7 of the comparator 14 turns to the high level and the signal xS7, to which the signal S7 is inverted by the inverter 13, turns to the low level.

This signal states causes a MOSFET that turns on during a period for which the pulse signal S5 is at the high level to be changed from the NMOSFET 5 in the case where the above-described divided voltage S6 is less than or equal to the reference voltage Vref to the NMOSFET 10. That is, the NMOSFETs 4 and 10 turn on during the period for which the pulse signal S5 is at the high level and the gate of the PMOSFET 2 is pulled down by the resistor 9.

On this occasion, the resistance value of the resistor 9 is smaller than that of the resistor 7'. For this reason, when VCC is low, a current value at the time of pulling down the gate of the PMOSFET 2 is less than that in the case where VCC is high, which prevents the gate voltage from exceeding a breakdown voltage and the gate of the PMOSFET 2 from being damaged when VCC is low.

Note that the operation of pulling down the gate of the PMOSFET 2 during a period for which the gate of the NMOSFET 4 is in the ON state is the same as the operation in the case where the NMOSFETs 19 and 26 are turned on, and it is thus considered that there is a possibility that, when VCC is low, the gate voltage of the PMOSFETs 18 and 25 exceeds a breakdown voltage and the gates are damaged. However, since the device size of the PMOSFETs 18 and 25 is generally small compared with the PMOSFET 2, the device size of the NMOSFETs 19 and 26 is also often set to be smaller than that of the NMOSFET 4. Thus, parasitic capacitance values (illustration omitted) of the NMOSFETs 19 and 26 are sufficiently small compared with the parasitic capacitance C1 of the NMOSFET 4. In this respect, in the present embodiment, a circuit (pull-down resistor switching circuit) that switches resistors for pulling down the PMOSFETs 18 and 25 depending on VCC is omitted for simplifying the circuit.

In the operation and determination described above, when the input signal S4 turns to the low level, the inverted signal 52 turns to the high level and the NMOSFET 1 thereby turns on. In addition, the NMOSFET 4 turns off and a pathway for pulling down the gate of the PMOSFET 2 is cut off, and, in conjunction therewith, the pulse signal S10 output from the one-shot circuit 24 turns to the high level and the NMOSFETs 26 and 27 thereby turn on.

This operation causes the gate signal of the PMOSFET 3 to be reduced by a resistor 28 and the PMOSFET 3 to thereby turn on, which causes the gate signal of the PMOSFET 2 to be raised to VCC and the PMOSFET 2 to thereby turn on. Thus, current supply from VCC to VOUT is cut off and VOUT thereby turns to the low level, which causes the NMOSFET 63 to turn off.

The operation described above enables the NMOSFET 63 to be on/off controlled by the high/low state of the signal S4.

In the embodiment, the control circuit 300, the boost converter 60, and the pull-down resistor switching circuit 31 correspond to a first circuit, a second circuit, and a resistor switching circuit, respectively.

In the embodiment, the resistance value of the resistor 7', the resistance value of the resistor 9, the resistance value of the series-connected resistors 7' and 8, and the PMOSFET 2 correspond to a second resistance value, a first resistance value, a third resistance value, and an output stage transistor, respectively.

In the embodiment, the NMOSFET 4, the PMOSFET 3, and the NMOSFET 19 correspond to a first transistor, a second transistor, and a third transistor, respectively.

In the embodiment, the NMOSFET 26, the PMOSFET 18, the PMOSFET 25, and the divided voltage S6 correspond to a fourth transistor, a fifth transistor, a sixth transistor, and high voltage system voltage, respectively.

Operation and Effect of Embodiment

The driver circuit 100 according to the embodiment includes the level shift circuit 30 and the output buffer circuit 50. The output buffer circuit 50 includes the NMOSFET 4, which is on/off controlled by the logic input signal S4 of the low voltage system (5-V power supply), the PMOSFET 3, which is connected in series to the NMOSFET 4 between the high potential side and the low potential side of the high voltage system (VCC power supply), the PMOSFET 2 at the output stage, which is on/off controlled by voltage at a connection point between the NMOSFET 4 and the PMOSFET 3, and the gate capacitance discharge circuit (variable resistance circuit) 51, which is connected between the gate of the PMOSFET 2 and the low voltage side of the VCC power supply via the NMOSFET 4. Further, the level shift circuit 30 includes the broadly defined flip-flop circuit that includes the NMOSFETs 19 and 26, which are on/off controlled complementarily with each other by the logic input signal S4, the PMOSFET 18, which is connected in series to the NMOSFET 19 between the high potential side and the low potential side of the VCC power supply, the PMOSFET 25, which is connected in series to the NMOS- FET 26 between the high potential side and the low potential side of the VCC power supply, and the broadly defined flip-flop circuit with a first memory node N1 that is a connection point between the NMOSFET 19 and the PMOSFET 18 is connected to the gate of the PMOSFET 25 and a second memory node N2 that is a connection point between the NMOSFET 26 and the PMOSFET 25 is connected to the gate of the PMOSFET 18, in which the gates of the NMOSFETs 19 and 26 serve as input terminals. In addition, the first memory node N2 is connected to the gate of the PMOSFET 3. Further, the level shift circuit 30 includes the resistor switching circuit 31 that reduces the resistance value of the gate capacitance discharge circuit (variable resistance circuit) 51 for a predetermined period (a period of $\Delta T1$) at the timing when the NMOSFET 4 turns on and, in conjunction therewith, when the voltage of the VCC power supply (the divided voltage S6, corresponding to VCC, in the embodiment) is higher than the preset reference voltage Vref, switches the pull-down resistor of the gate capacitance discharge circuit 51 during the period of $\Delta T1$ to the resistor 9 having the first resistance value and, when the divided voltage S6 is lower than the reference voltage Vref, switches the pull-down resistor during the period of $\Delta T1$ to the resistor 7' having the second resistance value, which is larger than the first resistance value.

This configuration enables, when the divided voltage S6 indicating the voltage VCC of the VCC power supply is higher than the reference voltage Vref, the pull-down resistor during the period of $\Delta T1$ to be switched to the resistor 9 and, when the divided voltage S6 is lower than or equal to the reference voltage Vref, the pull-down resistor to be switched to the resistor 7' having a resistance value larger than the resistance value of the resistor 9. This switching of the null-down resistor enables pull-down operation to be performed by the resistor 7' having a comparatively high resistance value in a region where VCC is low (region where VCC is set at an insufficiently high voltage value), which enables discharge current from the gate of the PMOSFET 2 to be suppressed. As a result, it becomes possible to prevent voltage exceeding a breakdown voltage from being applied to the PMOSFET 2 and to improve reliability in driving of a switching device in a wide range of voltage of the high voltage system.

Further, in the driver circuit 100 according to the embodiment, the resistor switching circuit 31 includes the voltage detection circuit 31a, which detects the divided voltage S6, into which the voltage VCC of the VCC power supply is divided by the resistors 16 and 17, as high voltage system voltage (voltage indicating VCC), and the comparator 14, which compares the divided voltage S6, detected by the voltage detection circuit 31a, with the reference voltage Vref, which is voltage of the reference voltage source 15. Further, the resistor switching circuit 31 also includes the switching circuit 31b, which, when the level of the output signal S7 of the comparator 14 is at the high level, which indicates that the divided voltage S6 is higher than the reference voltage Vref, switches the pull-down resistor during the period of $\Delta T1$ to the resistor 9 and, when the level of the output signal S7 is at the low level, which indicates that the divided voltage S6 is lower than or equal to the reference voltage Vref, switches the pull-down resistor during the period of $\Delta T1$ to the resistor 7'.

This configuration enables the voltage VCC of the VCC power supply, which is a high voltage power supply, to be divided and decreased to low voltage, which enables operational voltage and the voltage of the reference voltage source 15 to be lowered in the comparison processing in the comparator 14 at the succeeding stage. This capability enables the breakdown voltage of the comparator 14 to be lowered and thereby enables a component cost to be reduced.

Further, in the driver circuit 100 according to the embodiment, the level shift circuit 30 includes the Zener diodes 34, 35, and 6 for voltage clamping, which are connected between the first and second memory nodes N1 and N2 and the high potential side of the VCC power supply and between the gate of the PMOSFET 2 and the high potential side of the VCC power supply, respectively.

This configuration enables the breakdown voltage of the PMOSFETs 2, 18, and 25 to be set at low breakdown voltages.

Further, in the driver circuit 100 according to the embodiment, the gate capacitance discharge circuit (variable resistance circuit) 51 switches the pull-down resistor for pulling down the gate of the PMOSFET 2 to a resistor (series-connected resistors 7' and 8) having a larger resistance value than that of the resistor 7' after the period of $\Delta T1$ has elapsed.

This configuration enables an operation of flowing, as drain current ID3 of the NMOSFET 4, rapidly increasing current during the period of $\Delta T1$ to speed up the state transition of the PMOSFET 2 and subsequently returning the drain current ID3 to minute current. This operation enables power consumption to be reduced.

Variations

In the embodiment described above, it was assumed that the voltage detection circuit 31a was configured to detect the divided voltage S6, into which VCC is divided. However, without being limited to the configuration, the voltage detection circuit 31a may be configured to detect VCC itself. In this case, since VCC and the reference voltage Vref are to be compared with each other by the comparator 14, the reference voltage Vref is required to be set at a voltage corresponding to VCC.

Although, in the embodiment described above, the NMOSFET 63 of the boost converter 60 illustrated in FIG. 6 is exemplified as a switching device driven by the driver circuit 100, the present invention is not limited to the configuration. For example, it may be configured such that a switching device of a boost converter having another configuration is driven or a switching device of, without being limited to a boost converter, another type of converter, such as a buck converter, a buck-boost converter, and an inverting converter, is driven.

In the embodiment described above, the respective transistors are configured with unipolar transistors, such as a MOSFET. However, without being limited to the configuration, the driver circuit may be configured using another type of transistors, such as a bipolar transistor.

Although, in the embodiment described above, it was assumed that, assuming the low level voltage and the high level voltage of the logic input signal S4 to be denoted by VSS and VDD, respectively, VSS and VDD were 0 V and 5 V, respectively and, assuming the low level voltage and the high level voltage of the logic output signal VOUT to be denoted by VEE and VCC, respectively, VEE and VCC were 0 V and 10 V to 60 V, respectively, the present invention is not limited to the configuration. The respective voltage levels of the low voltage supply source and the high voltage supply source may be set at other voltages as long as satisfying a relation (VDD−VSS)<(VCC−VEE).

Although, in the embodiment described above, the above-described VSS, VDD, VEE, and VCC were assumed to have a relation VSS=VEE<VDD<VCC, the present invention is not limited to the configuration. For example, it may be configured such that the respective voltage levels have another relation, such as VEE<VCC≤VSS<VDD, VEE<VSS≤VCC≤VDD, VSS≤VEE<VDD≤VCC, and VSS<VDD≤VEE<VCC.

REFERENCE SIGNS LIST 1, 5, 10, 20, 55 NMOSFET
2 PMOSFET (output stage transistor)
3 PMOSFET (second transistor)
4 NMOSFET (first transistor)
6, 34, 35 Zener diode
7, 7', 8, 9, 16, 17, 21, 22, 53, 54 Resistor
11, 12 AND circuit
13 Inverter circuit
14 Comparator
15 Reference voltage source
18 PMOSFET (fifth transistor)
19 NMOSFET (third transistor)
23, 24 One-shot circuit
25 PMOSFET (sixth transistor)
26 NMOSFET (fourth transistor)
30, 130 Level shift circuit
31 Pull-down resistor switching circuit
31a Voltage detection circuit
31b switching circuit
32, 33 Variable resistance circuit
36 CMOS inverter
50 Output buffer circuit
51 Gate capacitance discharge circuit
52 Gate capacitance charging circuit
60 Boost converter (second circuit)
63 NMOSFET
100, 200 Driver circuit
300 Control circuit (first circuit)
FF Flip-flop circuit
N1, N2 Drain node (memory node)
C1 to C3 Parasitic capacitance
S4 Logic input signal with narrow logic amplitude
VOUT Logic output signal with wide logic amplitude

The invention claimed is:

1. A driver circuit for converting a logic input signal input from a first circuit operating in a low voltage power supply system to a logic output signal driving a second circuit operating in a high voltage power supply system, the driver circuit comprising:
a first transistor configured to be a first conductivity type transistor and on/off controlled by the logic input signal;
a second transistor configured to be a second conductivity type transistor, connected in series to the first transistor between a high potential side and a low potential side of the high voltage power supply system, and on/off controlled exclusively from the first transistor;
an output stage transistor configured to be a second conductivity type transistor at an output stage and on/off controlled by voltage at a connection point between the first transistor and the second transistor;
a variable resistance circuit configured to be connected between a gate of the output stage transistor and the low potential side of the high voltage power supply system via the first transistor; and
a resistor switching circuit configured to reduce a resistance value of the variable resistance circuit for a predetermined period at a timing when the first transistor turns on and, when voltage of the high voltage power supply system is higher than a preset reference voltage, switch a resistance value of the variable resistance circuit during the predetermined period to a first resistance value and, when voltage of the high voltage power supply system is lower than or equal to the reference voltage, switch the resistance value of the variable resistance circuit during the predetermined period to a second resistance value larger than the first resistance value.

2. The driver circuit according to claim 1, wherein the first conductivity type transistor and the second conductivity type transistor are an N-channel type metal oxide semiconductor field effect transistor (MOSFET) and a P-channel type MOSFET, respectively.

3. The driver circuit according to claim 1 comprising a Zener diode configured to be connected between the gate of the output stage transistor and the high potential side of the high voltage power supply system.

4. A driver circuit for converting a logic input signal input from a first circuit operating in a low voltage power supply system to a logic output signal driving a second circuit operating in a high voltage power supply system, the driver circuit comprising:
a first transistor configured to be a first conductivity type transistor and on/off controlled by the logic input signal;
a second transistor configured to be a second conductivity type transistor and connected in series to the first transistor between a high potential side and a low potential side of the high voltage power supply system;
an output stage transistor configured to be a second conductivity type transistor at an output stage and on/off controlled by voltage at a connection point between the first transistor and the second transistor;
a variable resistance circuit configured to be connected between a gate of the output stage transistor and the low potential side of the high voltage power supply system via the first transistor; and
a flip-flop circuit configured to include third and fourth transistors configured to be first conductivity type transistors and on/off controlled complementarily with each other by the logic input signal, a fifth transistor configured to be a second conductivity type transistor and connected in series to the third transistor between the high potential side and the low potential side of the high voltage power supply system, and a sixth transistor configured to be a second conductivity type transistor and connected in series to the fourth transistor between the high potential side and the low potential side of the high voltage power supply system, wherein a first memory node configured to be a connection point between the third transistor and the fifth transistor is connected to a gate of the sixth transistor, a second memory node configured to be a connection point between the fourth transistor and the sixth transistor is connected to a gate of the fifth transistor, and gates of the third and fourth transistors serve as input terminals, wherein
the first memory node or the second memory node is connected to a gate of the second transistor,
the driver circuit further comprising a resistor switching circuit configured to reduce a resistance value of the variable resistance circuit for a predetermined period at a timing when the first transistor turns on and, when voltage of the high voltage power supply system is higher than a preset reference voltage, switch a resistance value of the variable resistance circuit during the predetermined period to a first resistance value and, when voltage of the high voltage power supply system is lower than or equal to the reference voltage, switch the resistance value of the variable resistance circuit during the predetermined period to a second resistance value larger than the first resistance value.

5. The driver circuit according to claim 4, wherein
the first conductivity type transistor and the second conductivity type transistor are an N-channel type metal oxide semiconductor field effect transistor (MOSFET) and a P-channel type MOSFET, respectively.

6. The driver circuit according to claim 4, wherein
the resistor switching circuit includes:
   a voltage detection circuit configured to detect a high voltage system voltage that is a voltage of the high voltage power supply system;
   a comparator configured to compare a detected value of the high voltage system voltage detected by the voltage detection circuit with a reference voltage that is a voltage of a reference voltage source; and
   a switching circuit configured to, when a level of an output signal of the comparator is at a level indicating that the high voltage system voltage is higher than the reference voltage, switch the resistance value of the variable resistance circuit during the predetermined period to the first resistance value and, when the level of the output signal is at a level indicating that the high voltage system voltage is lower than or equal to the reference voltage, switch the resistance value of the variable resistance circuit during the predetermined period to the second resistance value.

7. The driver circuit according to claim 6, wherein
the voltage detection circuit outputs voltage into which voltage of the high voltage power supply system is divided as the detected value of the high voltage system voltage.

8. The driver circuit according to claim 4 comprising
Zener diodes configured to be respectively connected between the first and second memory nodes and the high potential side of the high voltage power supply system and between the gate of the output stage transistor and the high potential side of the high voltage power supply system.

9. The driver circuit according to claim 4, wherein
the resistor switching circuit switches the resistance value of the variable resistance circuit to a third resistance value that is larger than the second resistance value after the predetermined period has elapsed.

\* \* \* \* \*